United States Patent
Kimura et al.

(10) Patent No.: US 11,329,204 B2
(45) Date of Patent: May 10, 2022

(54) MICRO LIGHT EMITTING DIODE AND MANUFACTURING METHOD OF MICRO LIGHT EMITTING DIODE

(71) Applicant: SAMSUNG ELECTRONICS CO., LTD., Suwon-si (KR)

(72) Inventors: Shunsuke Kimura, Suwon-si (KR); Sungtae Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 113 days.

(21) Appl. No.: 16/724,776

(22) Filed: Dec. 23, 2019

(65) Prior Publication Data

US 2020/0203586 A1  Jun. 25, 2020

(30) Foreign Application Priority Data

Dec. 24, 2018  (KR) .................. 10-2018-0168726

(51) Int. Cl.
*H01L 33/60* (2010.01)
*H01L 33/00* (2010.01)
(Continued)

(52) U.S. Cl.
CPC .......... *H01L 33/60* (2013.01); *H01L 33/0095* (2013.01); *H01L 25/0753* (2013.01);
(Continued)

(58) Field of Classification Search
CPC ......... H01L 33/60; H01L 33/46; H01L 33/20; H01L 2933/0025; H01L 33/38
See application file for complete search history.

(56) References Cited

U.S. PATENT DOCUMENTS 6,635,903 B2  10/2003  Kato et al.
7,547,921 B2   6/2009  Illek et al.
(Continued)

FOREIGN PATENT DOCUMENTS

EP   2495761 A2   9/2012
JP   4-63478 A    2/1992
(Continued)

OTHER PUBLICATIONS

International Search Report (PCT/ISA/210) dated Apr. 17, 2020 by the International Searching Authority in counterpart International Application No. PCT/KR2019/018102.
(Continued)

*Primary Examiner* — Marcos D. Pizarro
*Assistant Examiner* — Antonio B Grite
(74) *Attorney, Agent, or Firm* — Sughrue Mion, PLLC

(57) ABSTRACT

A micro light emitting diode (LED), including a first semiconductor layer doped with an n-type dopant; a second semiconductor layer doped with a p-type dopant; an active layer arranged between the first semiconductor layer and the second semiconductor layer, and configured to provide light; a first side surface including a vertical side surface of the first semiconductor layer; a second side surface tilted with respect to the first side surface, and including a first tilted side surface of the active layer and a second tilted side surface of the second semiconductor layer; an insulating layer arranged to surround the first side surface and the second side surface; and a reflective layer arranged to partially surround the insulating layer in an area of the insulating layer corresponding to the second side surface.

18 Claims, 16 Drawing Sheets

(51) Int. Cl.
  *H01L 25/075* (2006.01)
  *H01L 33/38* (2010.01)
  *H01L 33/44* (2010.01)
  *H01L 33/62* (2010.01)
  *H01L 33/46* (2010.01)
  *H01L 33/20* (2010.01)

(52) U.S. Cl.
  CPC ............... *H01L 2933/0016* (2013.01); *H01L 2933/0058* (2013.01)

(56) References Cited

U.S. PATENT DOCUMENTS

| | | | |
|---|---|---|---|
| 7,939,841 B2 | 5/2011 | Lee et al. | |
| 8,686,447 B2 | 4/2014 | Tomoda et al. | |
| 9,293,660 B2 | 3/2016 | Chae et al. | |
| 9,397,269 B2 | 7/2016 | Chae et al. | |
| 9,530,939 B2 | 12/2016 | Chae et al. | |
| 9,859,469 B2 | 1/2018 | Chae et al. | |
| 9,997,673 B2 | 6/2018 | Chae et al. | |
| 10,355,171 B2 | 7/2019 | Chae et al. | |
| 10,559,716 B2 | 2/2020 | Oike et al. | |
| 10,672,952 B2 | 6/2020 | Chae et al. | |
| 2007/0176188 A1 | 8/2007 | Tanaka et al. | |
| 2011/0297914 A1 | 12/2011 | Zheng et al. | |
| 2014/0021505 A1* | 1/2014 | Huang | H01L 33/02 257/98 |
| 2015/0021622 A1 | 1/2015 | Sugiura et al. | |
| 2015/0108525 A1 | 4/2015 | Chae et al. | |
| 2015/0179904 A1 | 6/2015 | Maaskant et al. | |
| 2015/0214440 A1 | 7/2015 | Chae et al. | |
| 2016/0111615 A1* | 4/2016 | von Malm | H01L 27/14687 257/98 |
| 2016/0197239 A1 | 7/2016 | Kuo et al. | |
| 2016/0276542 A1 | 9/2016 | Chae et al. | |
| 2017/0084790 A1 | 3/2017 | Chae et al. | |
| 2017/0222088 A1* | 8/2017 | Klemp | H01L 33/20 |
| 2017/0352786 A1 | 12/2017 | Chae et al. | |
| 2018/0294382 A1 | 10/2018 | Chae et al. | |
| 2019/0088821 A1 | 3/2019 | Oike et al. | |
| 2019/0341527 A1 | 11/2019 | Chae et al. | |
| 2020/0127165 A1 | 4/2020 | Oike et al. | |

FOREIGN PATENT DOCUMENTS

| | | |
|---|---|---|
| JP | 6-318731 A | 11/1994 |
| JP | 2002-43633 A | 2/2002 |
| JP | 4123830 B2 | 7/2008 |
| JP | 4509217 B2 | 7/2010 |
| JP | 5754173 B2 | 7/2015 |
| KR | 20050066358 A * | 6/2005 |
| KR | 10-0593891 B1 | 6/2006 |
| KR | 10-2006-0077801 A | 7/2006 |
| KR | 10-0712890 B1 | 5/2007 |
| KR | 100712890 B1 * | 5/2007 |
| KR | 10-1106139 B1 | 1/2012 |
| KR | 10-2014-0002984 A | 1/2014 |
| WO | 2017/154973 A1 | 9/2017 |

OTHER PUBLICATIONS

Written Opinion (PCT/ISA/237) dated Apr. 17, 2020 by the International Searching Authority in counterpart International Application No. PCT/KR2019/018102.

Communication dated Oct. 26, 2021 by the European Patent Office in European Patent Application No. 19903610.4.

* cited by examiner

MICRO LIGHT EMITTING DIODE AND MANUFACTURING METHOD OF MICRO LIGHT EMITTING DIODE

CROSS-REFERENCE TO RELATED APPLICATION(S)

This application is based on and claims priority under 35 U.S.C. § 119(a) of a Korean patent application number 10-2018-0168726, filed on Dec. 24, 2018, in the Korean Intellectual Property Office, the disclosure of which is incorporated by reference herein in its entirety.

BACKGROUND

1. Field

The disclosure relates to a micro light emitting diode (LED) of which light efficiency and manufacturing efficiency have been improved, and a manufacturing method of a micro LED.

2. Description of Related Art

A micro LED may be formed of an ultra mini inorganic light emitting substance, and displays an image by emitting light by itself. Specifically, a micro LED may refer to an ultra mini LED which has a ⅒ length and a 1/100 area of those of a general light emitting diode (LED) chip, and of which width, length, and height are in sizes of between 10 and 250 micrometers (μm).

A micro LED may implement a display screen as it is arranged on a substrate of a display and provides and irradiates light toward the front. Meanwhile, a micro LED irradiates light not only on a top surface toward the front, but also on a side surface, and accordingly, in implementing a display screen, it is difficult to use light of a micro LED irradiated on a side surface. Accordingly, there are problems that the light efficiency of a micro LED is degraded, and power consumption of a display device increases.

In addition, for using side light of a micro LED, a side surface of a micro LED is formed as a tilted surface and side light is refracted and reflected on a top surface of the micro LED, but because of the tilted surface of the micro LED, there is a problem that the number of micro LEDs that can be generated on one growth substrate is reduced.

SUMMARY

Provided are a micro LED of which light efficiency and manufacturing efficiency have been improved, and a manufacturing method of a micro LED.

Additional aspects will be set forth in part in the description which follows and, in part, will be apparent from the description, or may be learned by practice of the presented embodiments.

In accordance with an aspect of the disclosure, a micro light emitting diode (LED) may include a first semiconductor layer doped with an n-type dopant; a second semiconductor layer doped with a p-type dopant, and arranged in a predetermined first area of a bottom surface of the first semiconductor layer; an active layer arranged between the first semiconductor layer and the second semiconductor layer, and configured to provide light; a first electrode pad arranged in a predetermined second area of the bottom surface of the first semiconductor layer; a second electrode pad arranged on the bottom surface of the second semiconductor layer; a first side surface including a vertical side surface of the first semiconductor layer; a second side surface tilted with respect to the first side surface, and including a first tilted side surface of the active layer and a second tilted side surface of the second semiconductor layer; an insulating layer arranged to surround the first side surface and the second side surface; and a reflective layer arranged to partially surround the insulating layer in an area of the insulating layer corresponding to the second side surface.

The reflective layer may be symmetrically arranged with respect to the active layer.

The reflective layer may be arranged at an angle in a range of 40 degrees to 50 degrees with respect to the first side surface.

The second side surface may include a portion of the first semiconductor layer.

A portion of the first side surface may be continuously connected with the second side surface, and the insulating layer may be formed integrally on the portion of the first side surface and the second side surface.

The insulating layer may include a first insulating part arranged on the first side surface; and a second insulating part arranged on the second side surface, and the first insulating part may be formed integrally with the second insulating part A height of the first electrode pad with respect to the first semiconductor layer may be equal to a height of the second electrode pad with respect to the first semiconductor layer.

The micro LED may further include a growth substrate arranged on one surface of the first semiconductor layer; and a buffer layer arranged between the first semiconductor layer and the growth substrate.

A length of the micro LED may be smaller than or equal to 250 μm.

A ratio of a length of the micro LED to a sum of a thickness of the first semiconductor layer, a thickness of the insulating layer, and a thickness of the second semiconductor layer may be smaller than 50.

In accordance with an aspect of the disclosure, a manufacturing method of a micro light emitting diode (LED) may include sequentially forming, on a growth substrate, a first semiconductor layer doped with an n-type dopant, an active layer configured to provide light, and a second semiconductor layer doped with a p-type dopant; forming a second side surface tilted with respect to the first semiconductor layer, and including a first tilted side surface of the active layer and a second tilted side surface of the second semiconductor layer; etching the active layer and the second semiconductor layer to be stepped with respect to the first semiconductor layer; etching the first semiconductor layer in a predetermined size to form a first side surface which extends from a portion of the second side surface and which is vertical to the first semiconductor layer; forming an insulating layer surrounding the first side surface and the second side surface; forming a reflective layer partially surrounding the insulating layer in an area of the insulating layer corresponding to the second side surface; forming a first electrode pad connected with the first semiconductor layer and a second electrode pad connected with the second semiconductor layer; and separating the first semiconductor layer from the growth substrate.

The reflective layer may be symmetrically formed with respect to the active layer.

The reflective layer may be formed at an angle in a range of 40 degrees to 50 degrees with respect to the first side surface.

A height of the first electrode pad with respect to the first semiconductor layer may be equal to a height of the second electrode pad with respect to the first semiconductor layer.

The first semiconductor layer may be separated from the growth substrate by a laser or chemical lift off method.

The active layer and the second semiconductor layer may be etched with isotropic etching.

The first semiconductor layer may be etched with unisotropic etching.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Hereinafter, embodiments will be described with reference to the accompanying drawings, for comprehensive understanding of the constitution and the effect of the disclosure. Meanwhile, it should be noted that the disclosure is not limited to the embodiments described herein, but may be implemented in various forms, and various modifications may be made to the embodiments. The descriptions of the embodiments are provided just to make the descriptions complete, and to assist a person having ordinary knowledge in the technical field to which the disclosure belongs in understanding the scope of the disclosure. Meanwhile, in the accompanying drawings, components were illustrated in more enlarged sizes than their actual sizes for the convenience of description, and the proportion of each component may be exaggerated or reduced.

In case it is described that a component is "on top of" or "contacts" another component, it should be understood that a component may directly contact or be connected with the top portion of another component, but still another component may exist between the components. In contrast, in case it is described that a component is "just on top of" or "directly contacts" another component, it may be understood that still another component does not exist between the components. Other expressions describing relations between components, for instance, expressions such as "between~" and "directly between~" may be interpreted in the same manner.

Also, the expressions "first," "second" and the like used in the disclosure may be used to describe various elements, but they are not intended to limit the elements. Such expressions are used only to distinguish one element from another element. For example, a first element may be called a second element, and a second element may be called a first element in a similar manner, without departing from the scope of the disclosure.

In addition, singular expressions also include plural expressions as long as they do not obviously mean differently in the context. In the disclosure, terms such as "include" and "have/has" should be construed as designating that there are such characteristics, numbers, steps, operations, elements, components or a combination thereof described in the specification, and can be interpreted to mean that one or more of other characteristics, numbers, steps, operations, elements, components or a combination thereof may be added.

The terms used in the embodiments may be interpreted as meanings generally known to those of ordinary skill in the art described in the disclosure, unless otherwise defined.

Hereinafter, the configuration of the micro LED 1 according to an embodiment will be described in detail with reference to FIGS. 1 and 2.

Figure 1:
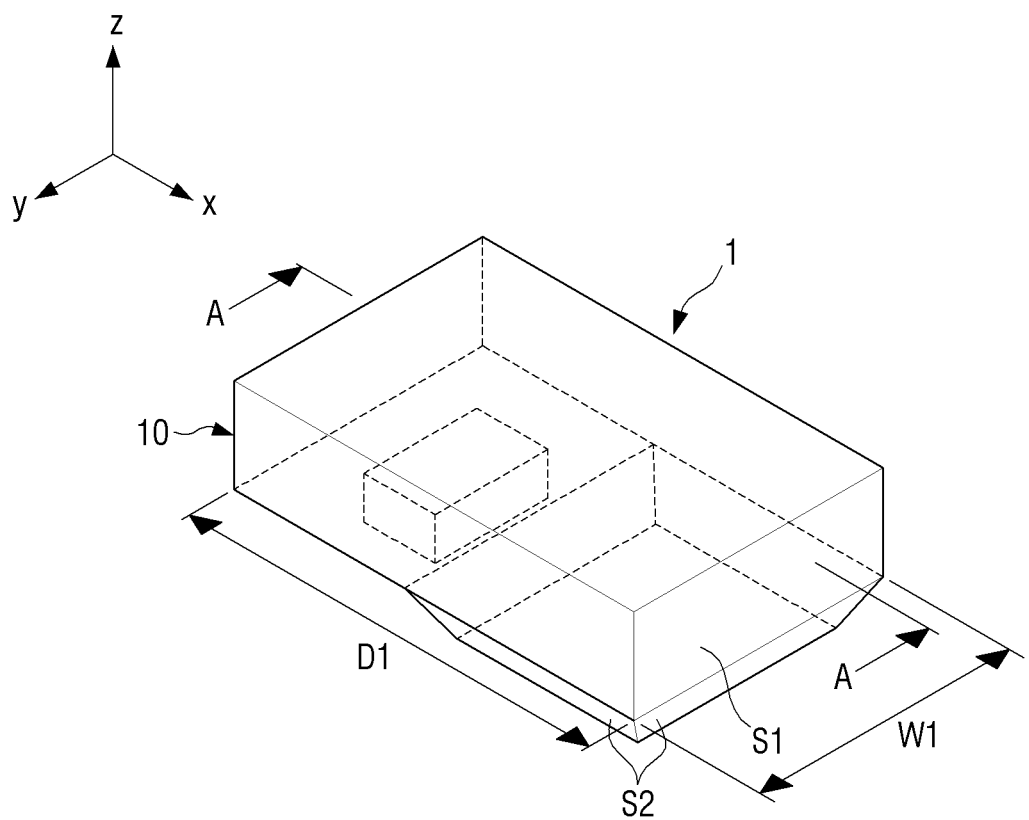
FIG. 1 is a perspective view illustrating a micro LED according to an embodiment.
Figure 2A:
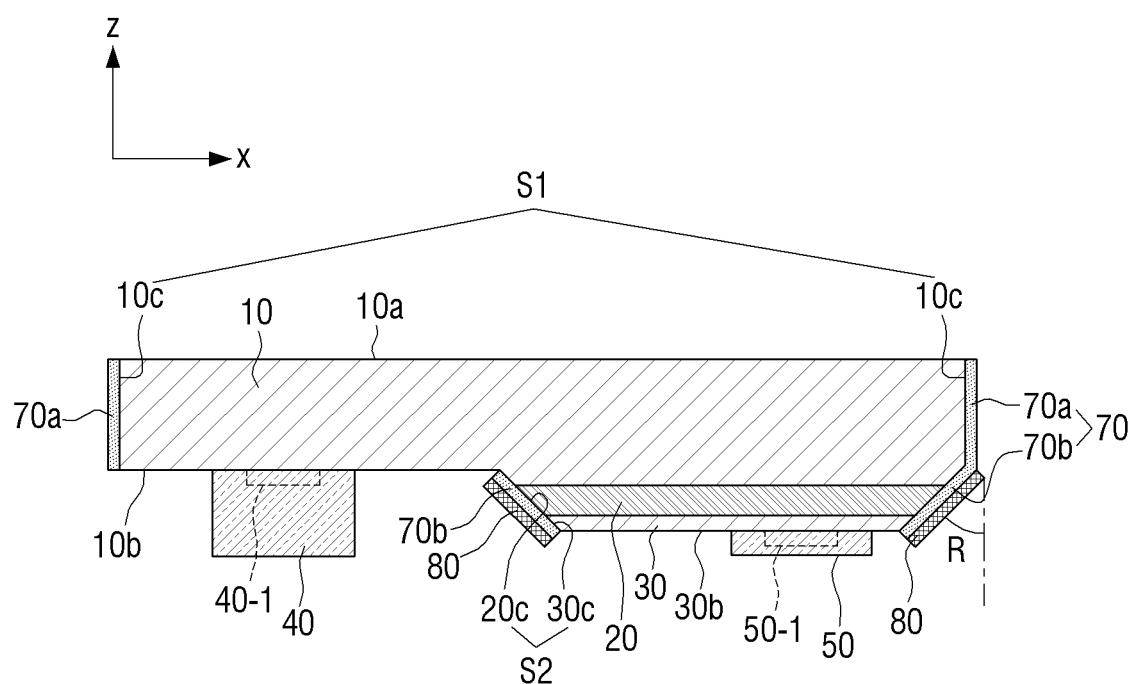
FIG. 2A is a cross-sectional view illustrated along A-A in FIG. 1.
Figure 2B:
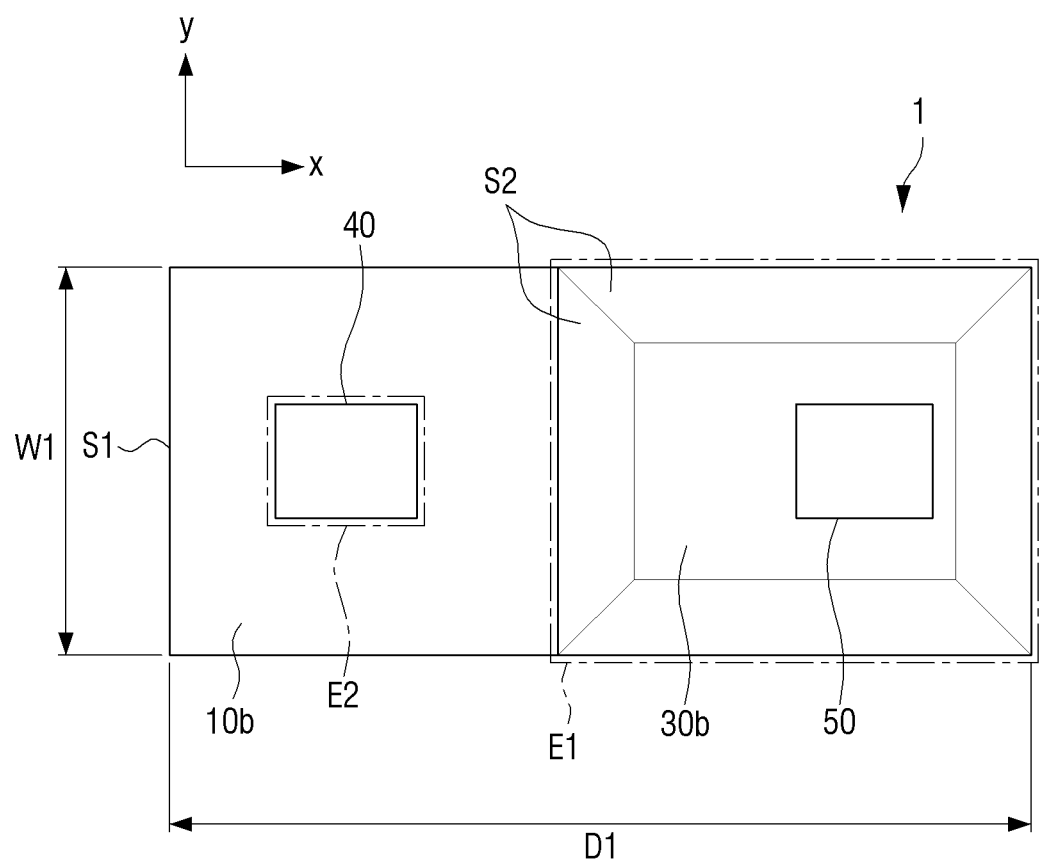
FIG. 2B is a bottom view of a micro LED according to an embodiment.

FIG. 1 is a perspective view illustrating the micro LED 1 according to an embodiment. FIG. 2A is a cross-sectional view illustrated along A-A in FIG. 1. FIG. 2B is a bottom view of the micro LED 1 according to an embodiment.

As illustrated in FIGS. 1 and 2, the micro LED 1 may include a first semiconductor layer 10 on which an n-type dopant is doped, which may mean that the first semiconductor layer is doped with an n-type dopant, a second semiconductor layer 30 which is arranged in a predetermined first area E1 of the bottom surface 10*b* of the first semiconductor layer 10, and on which a p-type dopant is doped, which may mean that the second semiconductor layer is doped with a p-type dopant, an active layer 20 which is arranged between the first semiconductor layer 10 and the second semiconductor layer 30, and provides light, a first electrode pad 40 arranged in a predetermined second area E2 of the bottom surface 10*b* of the first semiconductor layer 10, and a second electrode pad 50 arranged on the bottom surface 30*b* of the second semiconductor layer 30.

The first semiconductor layer 10 is a semiconductor layer that is grown and formed on a growth substrate 90 (refer to FIG. 4), and may have an n-type conductive type. Specifically, the first semiconductor layer 10 may be formed as a layer on which an n-type dopant is doped.

For example, the first semiconductor layer 10 may have n-type conductivity as n-type dopants such as Si, Ge, Sn, Se, and Te are doped.

Also, the first semiconductor layer 10 determines the size of the micro LED 1, and the size of the first semiconductor layer 10 can be deemed as the size of the micro LED 1. That is, on a plane (for example an XY plane), the area of the first semiconductor layer 10 may correspond to the area of the micro LED 1.

Accordingly, as illustrated in FIGS. 1, 2B, 13A, and 13B, if the first semiconductor layer 10 is etched at a length D1 and a width W1 determined on one growth substrate 90, a plurality of micro LEDs 1, 2 having the same sizes as a structure including the determined length D1 and width W1 may be generated.

For example, as the first semiconductor layer 10 is etched at a length D1 and a width W1 determined on one growth substrate 90, a plurality of micro LEDs 1, 2 having the same structures may be formed.

In addition, the number of a plurality of micro LEDs 1 formed on the growth substrate 90 may be diverse.

Thus, according to the determined length D1 and width W1 of the first semiconductor layer 10, the number of micro LEDs 1 that can be generated on one growth substrate 90 may vary.

For example, as illustrated in FIGS. 1 and 2B, the determined length D1 may be smaller than or equal to 250 μm. That is, the length D1 of one micro LED 1 may be smaller than or equal to 250 μm.

In addition, the width W1 of the micro LED 1 may be the same as the length D1 of the micro LED 1. For example, if the length D1 of the micro LED 1 is 100 μm, the width W1 of one micro LED 1 may also be 100 μm. Accordingly, the top surface of the micro LED 1 may be in the form of a square.

Also, the first semiconductor layer 10 may have a vertical first side surface S1 at its corner. Here, "vertical" may mean a vertical direction (a Z axis direction) with respect to the flat top surface 10a or bottom surface 10b of the first semiconductor layer 10. That is, a side surface 10c of the first semiconductor layer 10 may constitute a vertical first side surface S1.

Accordingly, as the first semiconductor layer 10 has a vertical first side surface S1, the number of micro LEDs that can be generated on one growth substrate 90 may increase.

For example, if the side surface of the first semiconductor layer 10 consists of a tilted surface, the area of the first semiconductor layer 10 becomes broader, and accordingly, the number of micro LEDs that can be generated on one growth substrate 90 decreases.

However, if the first semiconductor layer 10 has a vertical first side surface S1, the area of the first semiconductor layer 10 may be smaller than that of a structure wherein the side surface of the first semiconductor layer 10 consists of a tilted surface.

Accordingly, through a structure wherein the first semiconductor layer 10 has a vertical first side surface S1, the number of generated micro LEDs 1 can be maximized, and manufacturing efficiency can be improved.

Figure 3:
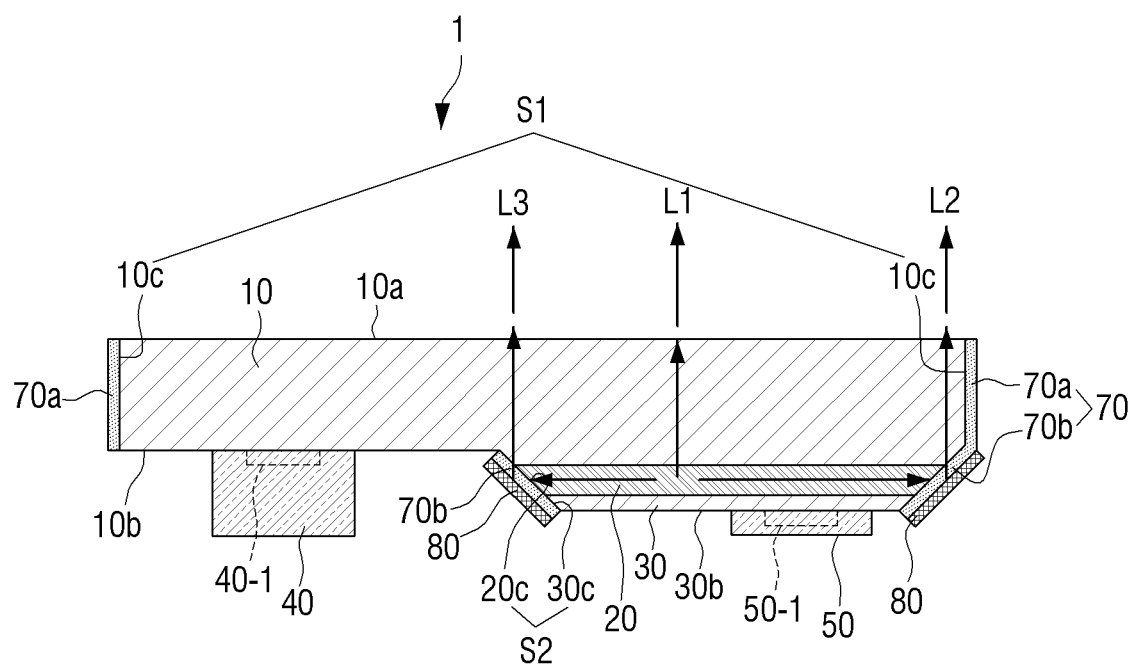
FIG. 3 is a cross-sectional view illustrating an operation of a micro LED according to an embodiment.

In addition, the first semiconductor layer 10 may include a material through which light can pass. Accordingly, as illustrated in FIG. 3, even if first light L1 and second light L2 generated on the active layer 20 pass through the first semiconductor layer 10, the amount of lost light is reduced, and thus light efficiency can be improved.

The second semiconductor layer 30 may have a p-type conductive type. Specifically, the second semiconductor layer 30 may be formed as a layer on which a p-type dopant is doped. For example, the second semiconductor layer 30 may have p-type conductivity as p-type dopants such as Zn, Mg, Co, Ni, Cu, Fe, and C are doped.

In addition, the second semiconductor layer 30 may be arranged in a predetermined first area E1 of the bottom surface 10b of the first semiconductor layer 10.

Here, a predetermined first area E1 may mean a partial area of the bottom surface 10b of the first semiconductor layer 10. Also, the first area E1 may include a corner of the first semiconductor layer 10. That is, if the active layer 20 is formed to be thin, the side surface of the second semiconductor layer 30 may be connected with the first side surface S1 of the first semiconductor layer 10. In addition, the predetermined first area E1 may be determined while an area wherein the first electrode pad 40 will be formed is left in the remaining area of the bottom surface 10b of the first semiconductor layer 10 in the predetermined first area E1.

The second semiconductor layer 30 may include the same base material as the first semiconductor layer 10. However, as dopants are different, the second semiconductor layer 30 may have a complementary conductive type with the first semiconductor layer 10.

For example, the first semiconductor layer 10 may provide electrons, and the second semiconductor layer 30 may provide holes.

Also, the second semiconductor layer 30 may have a first tilted side surface 30c which is broad in the upper area (for example, in the Z axis direction) and is tilted with respect to the first side surface S1. Here, the upper area may mean the direction wherein the first semiconductor layer 10 is arranged based on the second semiconductor layer 30.

That is, as the second semiconductor layer 30 becomes farther in a lower direction from the first semiconductor layer 10, the cross-sectional area may gradually decrease.

The active layer 20 may be arranged between the first semiconductor layer 10 and the second semiconductor layer 30 and provide light. That is, the second semiconductor layer 30, the active layer 20, and the first semiconductor layer 10 may have a structure wherein they are laminated sequentially.

The active layer 20 is a layer wherein electrons provided from the first semiconductor layer 10 and holes provided from the second semiconductor layer 30 are recombined and light of a specific wavelength is output, and it may have a single quantum well structure or a multi-quantum well (MQW) structure as well layers and barrier layers are laminated alternatingly.

Accordingly, light provided on the active layer 20 may be irradiated on the top and bottom surfaces and side surfaces of the active layer 20.

Also, the active layer 20 may have a second tilted side surface 20c which is broad in the upper area (the Z axis direction) and is tilted with respect to the first side surface S1. Here, the upper area may mean the direction wherein the first semiconductor layer 10 is arranged based on the active layer 20.

That is, as the active layer 20 becomes farther in a lower direction from the first semiconductor layer 10, the cross-sectional area may gradually decrease.

Also, the cross-sectional area of the active layer 20 may be smaller than the cross-sectional area of the first semiconductor layer 10 and bigger than the cross-sectional area of the second semiconductor layer 30.

Accordingly, the active layer 20 and the second semiconductor layer 30 may have a second side surface S2 tilted with respect to the vertical first side surface S1 of the first semiconductor layer 10. Specifically, the first tilted side surface 30c of the second semiconductor layer 30 and the second tilted side surface 20c of the active layer 20 may constitute a second side surface S2.

In addition, the second side surface S2 may include a portion of the first semiconductor layer 10. That is, a portion of the first semiconductor layer 10 may also include a tilted side surface.

The first electrode pad 40 may be arranged in a predetermined second area E2 of the bottom surface 10b of the first semiconductor layer 10. Here, the second area E2 means an area of the bottom surface 10b of the first semiconductor layer 10 other than the first area E1, and the size of the second area E2 may be diverse.

Also, the first electrode pad 40 may include a conductive material, and may be electronically connected with the first semiconductor layer 10. In addition, the first electrode pad 40 may be connected with a thin film transistor substrate (not shown) on which the micro LED 1 is mounted, and transmit an electronic signal to the micro LED 1.

Specifically, the first electrode pad 40 may be arranged in a form of being electronically connected with the first semiconductor layer 10 and electronically connected with an n-electrode 40-1 that is formed to protrude from the bottom surface 10b of the first semiconductor layer 10 and at the same time, surrounding the n-electrode 40-1.

Here, the n-electrode 40-1 may include Au, Cu, Indium Tin Oxide (ITO), etc.

Accordingly, if the micro LED 1 is mounted on a thin film transistor substrate by a method such as soldering, damage to the n-electrode may be prevented.

In addition, the height of the first electrode pad 40 from the first semiconductor layer 10 may be the same as the height of the second electrode pad 50. Accordingly, if the micro LED 1 is mounted on a thin film transistor substrate, the micro LED 1 may not be tilted to one side, but may be arranged to be flat on a thin film transistor substrate.

The second electrode pad 50 may be arranged on the bottom surface 30b of the second semiconductor layer 30, and may include a conductive material, and may be electronically connected with the second semiconductor layer 30.

Specifically, the second electrode pad 50 may be arranged in a form of being electronically connected with the second semiconductor layer 30 and electronically connected with a p-electrode 50-1 that is formed to protrude from the bottom surface 30b of the second semiconductor layer 30 and at the same time, surrounding the p-electrode.

Here, the p-electrode 50-1 may include Au, Cu, Indium Tin Oxide (ITO), etc.

Accordingly, if the micro LED 1 is mounted on a thin film transistor substrate by a method such as soldering, damage to the p-electrode 50-1 may be prevented.

In addition, the heights of the first electrode pad 40 and the second electrode pad 50 may be the same with respect to the first semiconductor layer 10.

Also, the first electrode pad 40 and the second electrode pad 50 may be formed on the bottom surface of the micro LED 1.

That is, on the micro LED 1, the first and second electrode pads 40, 50 are arranged in the lower part of the micro LED 1, and thus the micro LED 1 may be formed as a flip chip type.

Such a micro LED 1 of a flip chip type may allow for miniaturization, weight lightening, and high integration of diodes. Also, in manufacturing a display device, by virtue of the structure of the micro LED 1, electrodes do not restrict a light emitting area, and thus light emitting efficiency can be improved. In addition, in combination with a thin film transistor substrate, an intermediate medium such as a wire is not used, and thus efficiency of a transferring process, etc. can be improved. A display module according to an embodiment may be applied to an electronic product or an electronic device that requires a wearable device, a portable device, a handheld device, or various displays, in a single unit. The display module can also be applied to a display device such as a monitor for a personal computer, a TV and digital signage, an electronic display through a plurality of assembly arrangements.

Also, the micro LED 1 may include an insulating layer 70. The insulating layer 70 may be arranged to surround the vertical first side surface S1 and the second side surface S2 tilted with respect to the first side surface S2. Specifically, the insulating layer 70 may include a first insulating part 70a surrounding the first side surface S1 and a second insulating part 70b surrounding the tilted second side surface S2.

Accordingly, the insulating layer 70 may wholly surround the top surface 10a of the first semiconductor layer 10, the bottom surface 10b excluding the first area E1, and the side surface of the micro LED 1 excluding the bottom surface 30b of the second semiconductor layer 30.

Also, the insulating layer 70 may include a non-conductive material.

Accordingly, the insulating layer 70 may prevent detachment of electrons for providing light at the micro LED 1 to the outside of the micro LED 1, and thereby improve the light efficiency of the micro LED 1.

In addition, the insulating layer 70 may prevent electrical short of the micro LED 1 with an adjacent conductor or electronic device outside, and thereby improve the structural stability of the micro LED 1.

Also, the insulating layer 70 may be arranged as a structure of wholly surrounding the corner area of the micro LED 1, and thereby improve the structural durability of each layer included in the micro LED 1.

Further, the insulating layer 70 may include a material having light permeability over a certain level. Accordingly, absorption of light provided at the active layer 20 into the insulating layer 70 may be prevented, and light efficiency of the micro LED 1 may thereby be improved.

The insulating layer 70 may be formed integrally on a portion of the first side surface S1 and the second side surface S2. Specifically, as illustrated in FIGS. 1 and 2A, a portion of the first side surface S1 is continuously connected with the second side surface S2, and thus the first insulating part 70a and the second insulating part 70b of the insulating layer 70 may be formed integrally.

Accordingly, even if an edged part is formed between the vertical first side surface S1 and the tilted second side surface S2 of the micro LED 1, the first insulating part 70a and the second insulating part 70b of the insulating layer 70 are formed integrally, and thus electrons of the micro LED 1 are detached to the edged part, or a part that is structurally weak is enclosed, and structural stability can thereby be improved.

Also, the micro LED 1 may include a reflective layer 80 that is arranged to surround the second side surface S2 in a partial area of the insulating layer 70, and reflects and refracts light provided on the active layer 20 in the direction of the first semiconductor layer 10.

Specifically, the reflective layer 80 may be laminated on the second insulating part 70b of the insulating layer 70, and reflect and refract light that is provided on the active layer 20 and passes through the insulating layer 70 to the upper part of the micro LED 1.

Also, the reflective layer 80 may be arranged to surround the tilted side surface 30c of the active layer 20.

Accordingly, the direction of the side light provided on the active layer 20 of the micro LED 1 may be changed to the upper direction necessary for implementing a display screen, and the light efficiency of the micro LED 1 can thereby be improved.

In addition, the reflective layer 80 may include metal having high reflectivity for reflecting light. For example, the reflective layer 80 may include metal such as aluminum (Al), silver (Ag), and nickel (Ni).

Also, the reflective layer 80 may be symmetrically arranged with respect to the active layer 20. For example, as illustrated in FIG. 1, the reflective layer 80 may be symmetrically arranged on four tilted side surfaces 30c of the active layer 20 with the active layer 20 as the center, and reflect and refract at once the light irradiated from the four tilted side surfaces 30c of the active layer 20 in the direction wherein the first semiconductor layer 10 is arranged.

Accordingly, concentration of light provided at the micro LED 1 in the direction of one side of the micro LED 1 is prevented, and thus uniform luminance of the micro LED 1 can be implemented.

In addition, the reflective layer 80 may be arranged at an angle of from 40 to 50 degrees with respect to the first side surface S1. Specifically, as illustrated in FIG. 2A, the reflective layer 80 may be arranged at an R angle with respect to the first side surface S1. Here, the R angle is an angle at which light provided on the active layer 20 can be reflected and refracted to the upper part of the micro LED 1. For example, the R angle may be from 40 to 50 degrees.

Hereinafter, the operation of the micro LED 1 according to an embodiment will be described with reference to FIG. 3.

FIG. 3 is a cross-sectional view illustrating an operation of the micro LED 1 according to an embodiment.

In the micro LED 1, an electronic signal is introduced into the first electrode pad 40 and the second electrode pad 50, and accordingly, electrons provided from the first semiconductor layer 10 and holes provided from the second semiconductor layer 30 are recombined and light may be provided on the active layer 20.

Specifically, light may include first light L1 irradiated in a vertical direction to the active layer 20 and second light L2 and third light L3 irradiated side by side in the direction of the plane of the active layer 20.

That is, the first light L1 may be irradiated in the upper direction wherein the first semiconductor layer 10 is arranged, and the second light L2 and the third light L3 may be irradiated on the side surface 20c of the active layer 20.

Afterwards, the second light L2 and the third light L3 may pass through the insulating layer 70 arranged on the side surface 20c of the active layer 20, and may be refracted and reflected from the reflective layer 80 laminated on the insulating layer 70 in the direction wherein the first semiconductor layer 10 is arranged.

That is, the directions of the second light L2 and the third light L3 may be changed to the same direction as the first light L1 through the reflective layer 80.

Accordingly, in addition to implementation of a display screen by the first light L1 irradiated on the top surface of the micro LED 1, the directions of the second light L2 and the third light L3 are also changed to the same direction as the first light L1, and thus the same display screen as the first light L1 is implemented, and accordingly, the light efficiency of the micro LED 1 can be improved.

Also, as described above, the side surface 10c of the first semiconductor layer 10 constituting the side surface of the micro LED 1 is formed to be vertical, and accordingly, the number of micro LEDs 1 that can be produced on one growth substrate 90 can be increased.

That is, through the reflective layer 80 arranged on the vertical first side surface and the partially tilted second side surface of the micro LED 1 according to an embodiment, the light efficiency of the micro LED 1 can be improved, and at the same time, a large number of micro LEDs 1 can be produced.

Accordingly, the light efficiency and the manufacturing efficiency of the micro LED 1 can be improved at the same time.

Hereinafter, the manufacturing process of the micro LED 1 according to an embodiment will be described in detail with reference to FIGS. 4 to 14.

Figure 4:
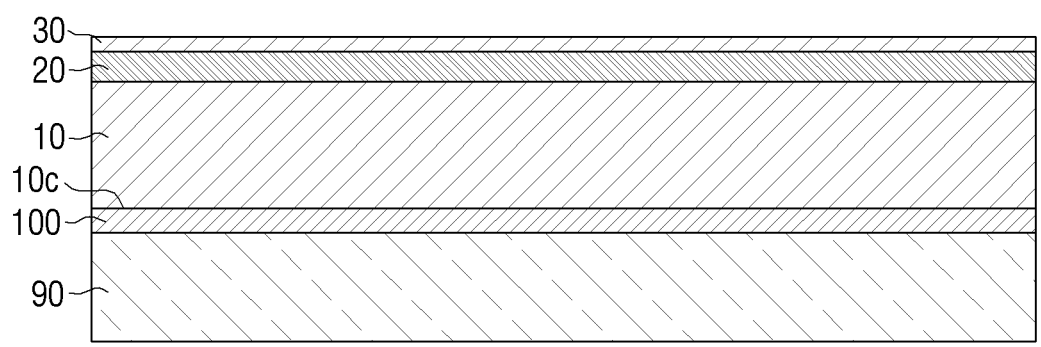
FIG. 4 is a cross-sectional view illustrating sequential formation of a first semiconductor layer, an active layer, and a second semiconductor layer on a growth substrate according to an embodiment.

FIG. 4 is a cross-sectional view illustrating sequential formation of a first semiconductor layer, an active layer, and a second semiconductor layer on a growth substrate.

Figure 5:
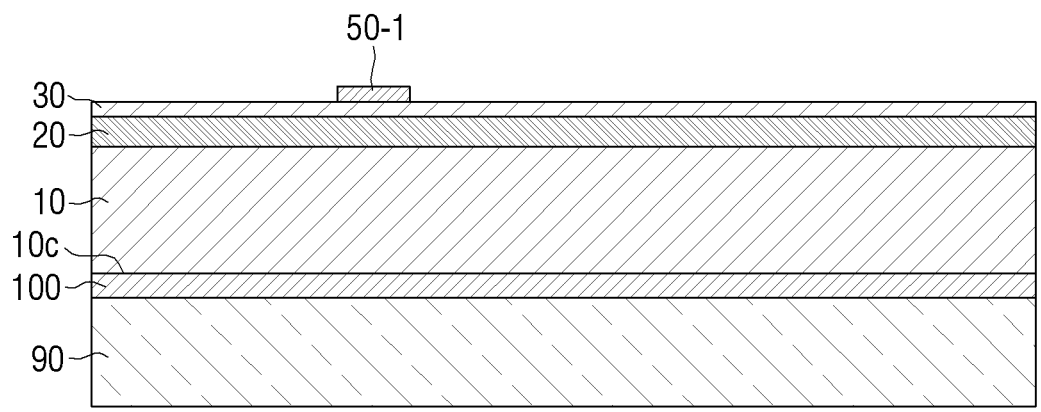
FIG. 5 is a cross-sectional view illustrating formation of a p-electrode in the configuration in FIG. 4 according to an embodiment.
Figure 6:
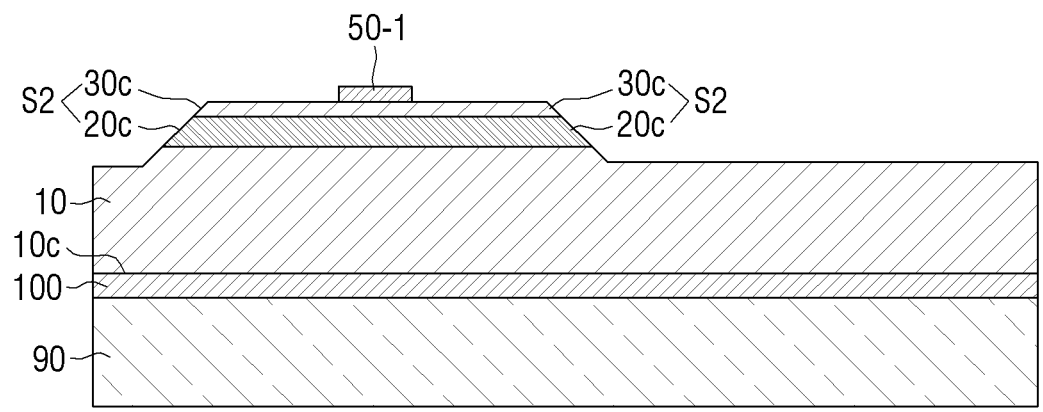
FIG. 6 is a cross-sectional view illustrating etching of an active layer and a second semiconductor layer in the configuration in FIG. 5 according to an embodiment.
Figure 7:
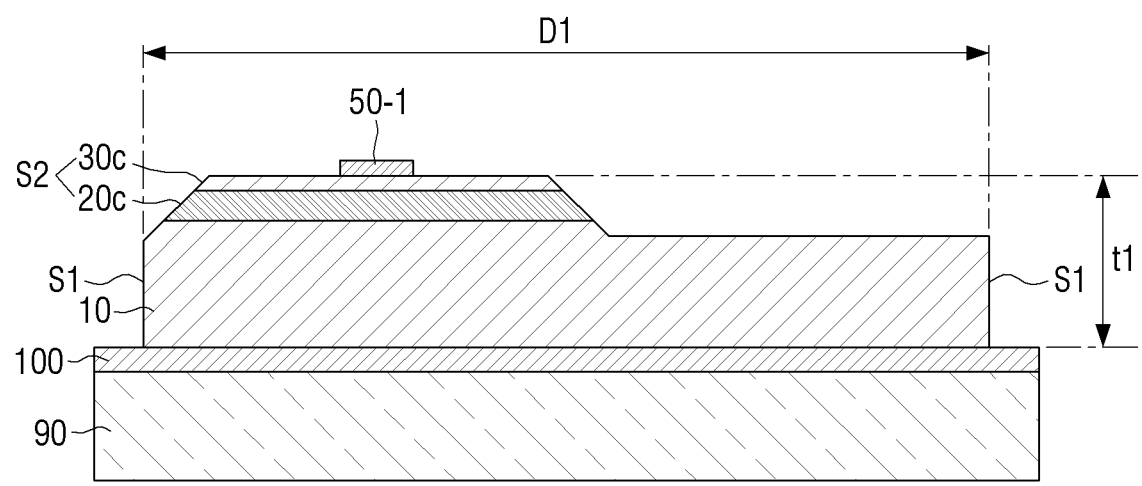
FIG. 7 is a cross-sectional view illustrating etching of a first side surface of a first semiconductor layer in the configuration in FIG. 6 according to an embodiment.
Figure 8:
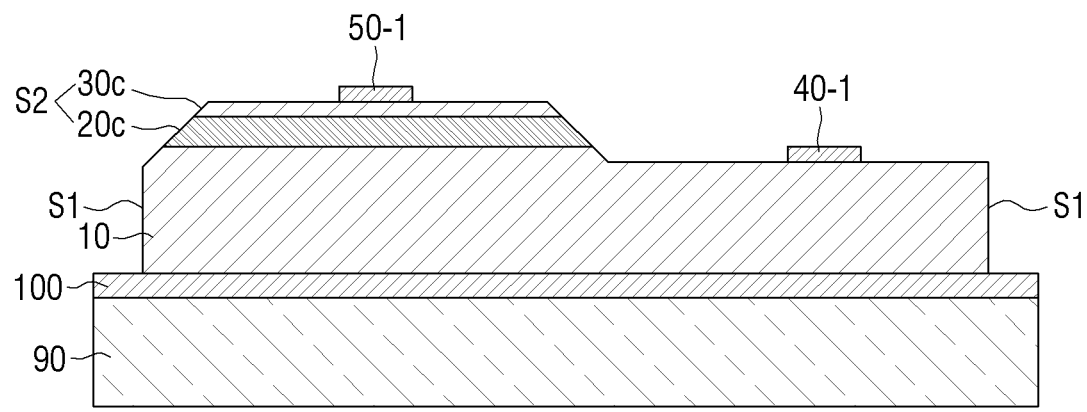
FIG. 8 is a cross-sectional view illustrating formation of an n-electrode in the configuration in FIG. 7 according to an embodiment.
Figure 9:
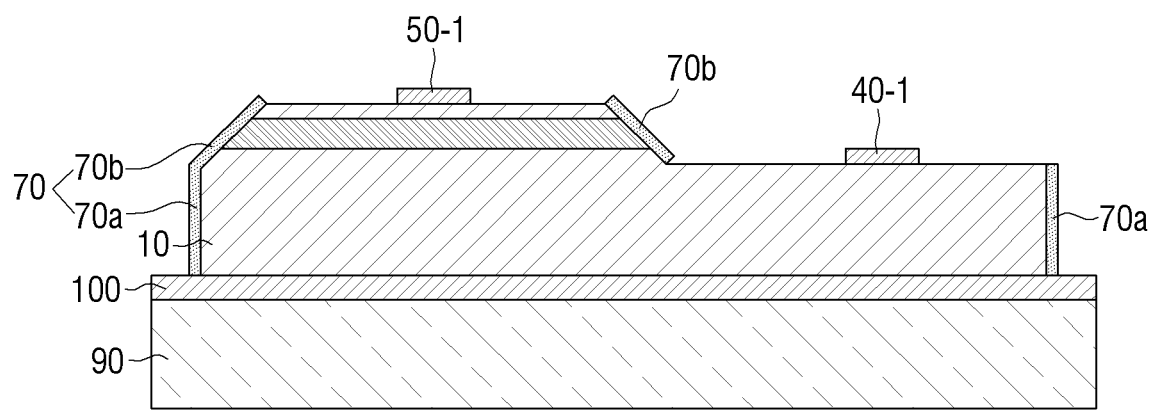
FIG. 9 is a cross-sectional view illustrating formation of an insulating layer in the configuration in FIG. 8 according to an embodiment.
Figure 10:
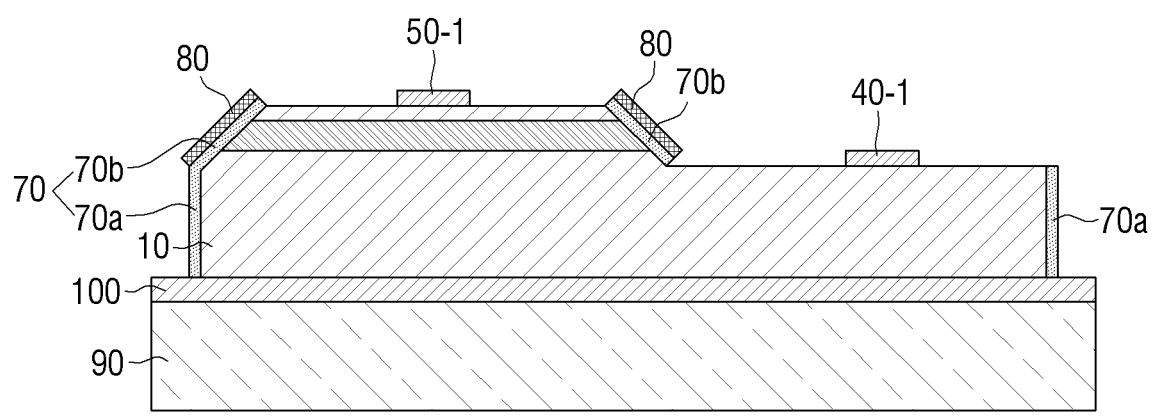
FIG. 10 is a cross-sectional view illustrating formation of a reflective layer in the configuration in FIG. 9 according to an embodiment.
Figure 11:
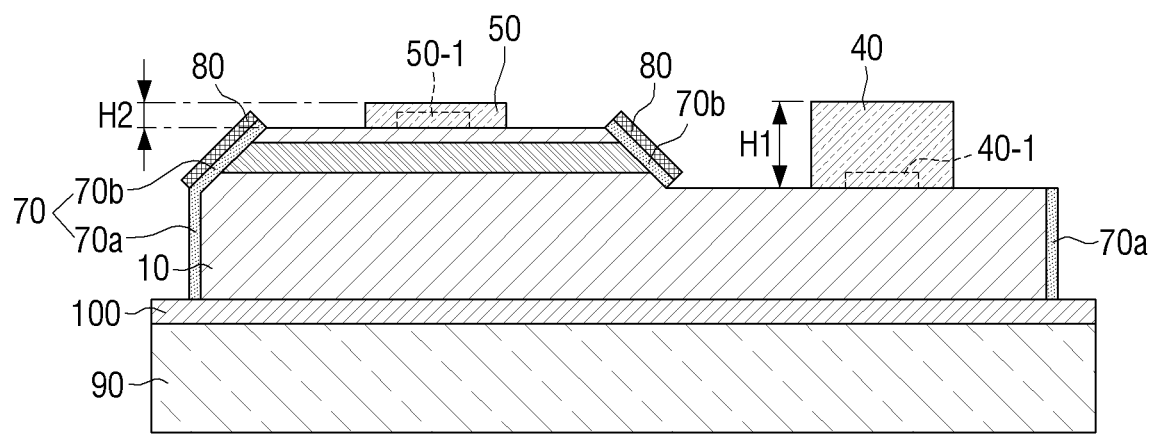
FIG. 11 is a cross-sectional view illustrating formation of a first electrode pad and a second electrode pad in the configuration in FIG. 10 according to an embodiment.
Figure 12:
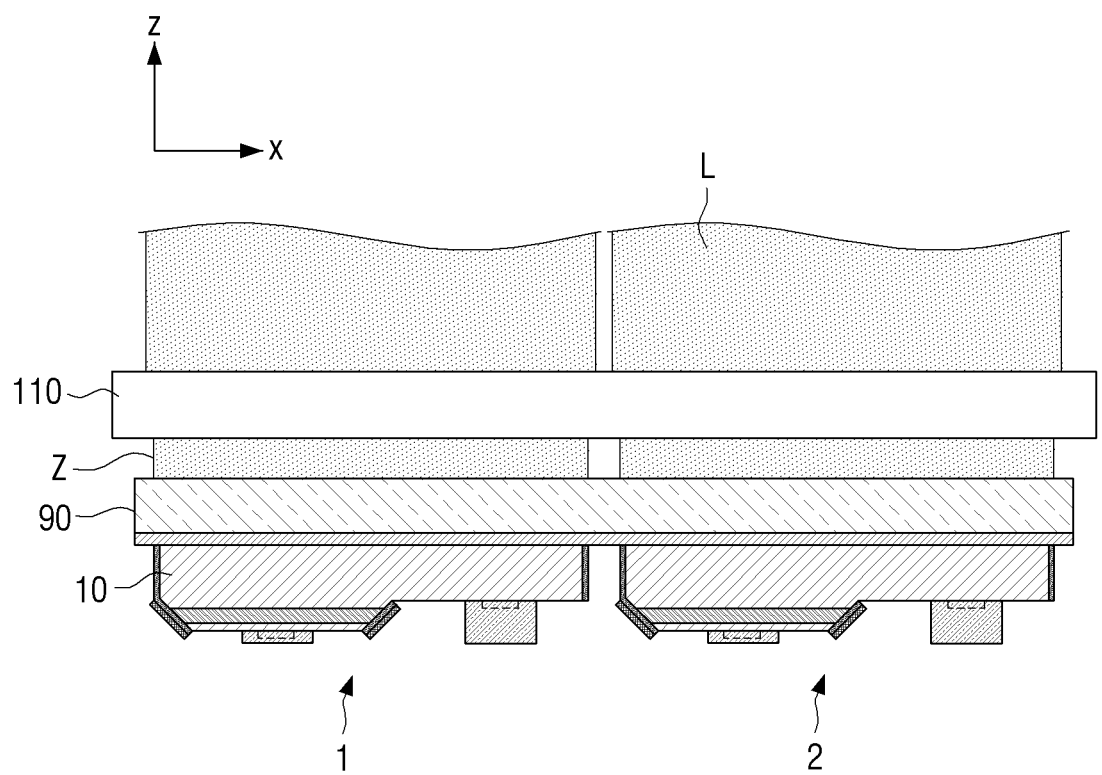
FIG. 12 is a schematic diagram illustrating separation of a plurality of micro LEDs from a growth substrate by a laser lift off method according to an embodiment.
Figure 13A:
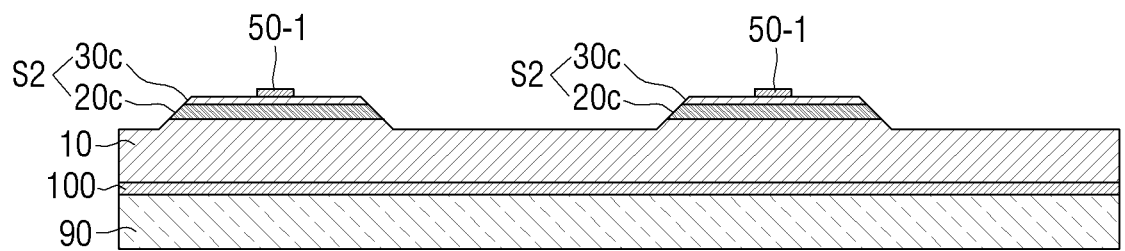
FIG. 13A is a cross-sectional view illustrating formation of a second side surface of each of a plurality of micro LEDs on a growth substrate according to an embodiment.
Figure 13B:
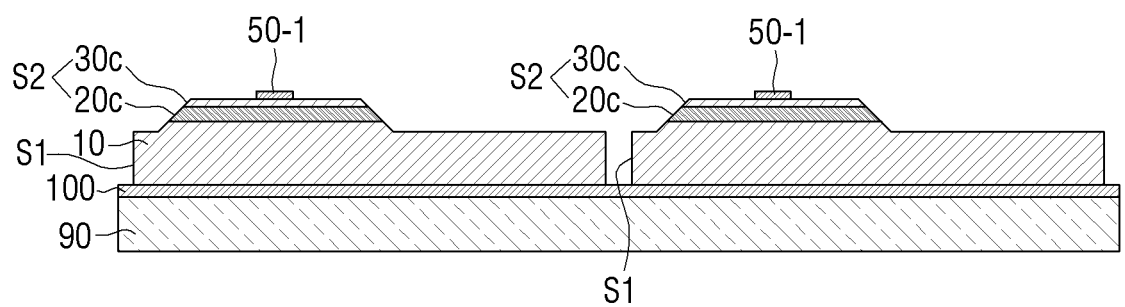
FIG. 13B is a cross-sectional view illustrating formation of a first side surface of each of a plurality of micro LEDs according to an embodiment.
Figure 14:
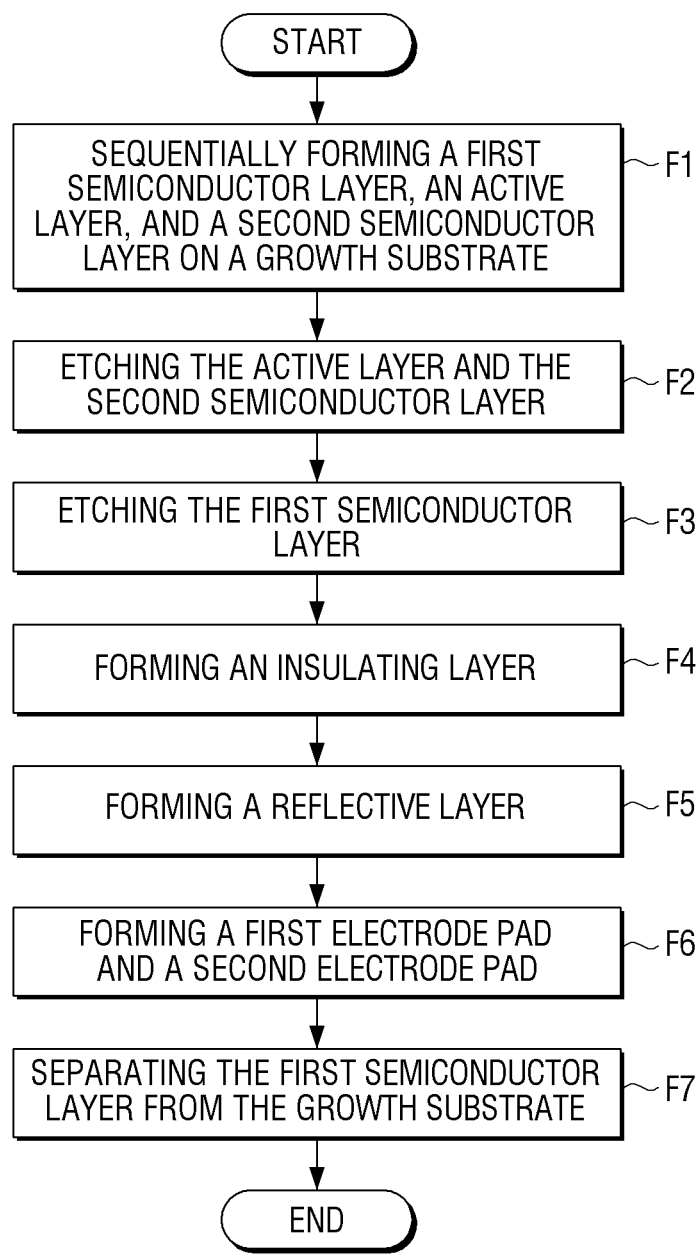
FIG. 14 is a flow chart illustrating a manufacturing method of a micro LED according to an embodiment.

FIG. 5 is a cross-sectional view illustrating formation of the p-electrode 50-1 in the configuration in FIG. 4. FIG. 6 is a cross-sectional view illustrating etching of the active layer 20 and the second semiconductor layer 30 in the configuration in FIG. 5. FIG. 7 is a cross-sectional view illustrating etching of the first side surface S1 of the first semiconductor layer 10 in the configuration in FIG. 6. FIG. 8 is a cross-sectional view illustrating formation of the n-electrode 40-1 in the configuration in FIG. 7. FIG. 9 is a cross-sectional view illustrating formation of the insulating layer 70 in the configuration in FIG. 8. FIG. 10 is a cross-sectional view illustrating formation of the reflective layer 80 in the configuration in FIG. 9. FIG. 11 is a cross-sectional view illustrating formation of the first electrode pad 40 and the second electrode pad 50 in the configuration in FIG. 10. FIG. 12 is a schematic diagram illustrating separation of a plurality of micro LEDs 1, 2 from the growth substrate 90 by a laser lift off method. FIG. 13A is a cross-sectional view illustrating formation of the second side surface S2 of each of a plurality of micro LEDs 1, 2 on the growth substrate 90 according to an embodiment. FIG. 13B is a cross-sectional view illustrating formation of the first side surface S1 of each of a plurality of micro LEDs 1, 2 according to an embodiment. FIG. 14 is a flow chart illustrating a manufacturing method of the micro LED 1 according to an embodiment.

First, as illustrated in FIG. 4, on the growth substrate 90, the first semiconductor layer 10, the active layer 20, and the second semiconductor layer 30 may be formed while being laminated sequentially at operation F1.

That is, on one surface of the first semiconductor layer 10, the growth substrate 90 may be arranged.

Here, as illustrated in FIG. 7, the sum t1 of the thicknesses of the first semiconductor layer 10, the active layer 20, and the second semiconductor layer 30 formed on the growth substrate 90 while being laminated may be smaller than or equal to 50 μm.

In addition, the ratio of the length D1 of one micro LED 1 with respect to the thickness t1 of the first semiconductor layer 10, the active layer 20, and the second semiconductor layer 30 may be smaller than 50.

That is, the size of the micro LED 1 may be formed such that the ratio of the length D1 of one micro LED 1 with respect to the total thickness t1 of the first semiconductor layer 10, the active layer 20, and the second semiconductor layer 30 is smaller than 50.

For example, if the length D1 of one micro LED 1 is formed as 100 μm, the total thickness t1 of the first semiconductor layer 10, the active layer 20, and the second semiconductor layer 30 may be formed to be bigger than 2 μm.

In addition, if the total thickness t1 of the first semiconductor layer 10, the active layer 20, and the second semiconductor layer 30 of one micro LED 1 is formed as 5 μm, the length D1 of one micro LED 1 may be formed to be smaller than 250 μm.

Further, the growth substrate 90 is a mother substrate for growing the first semiconductor layer 10, and it may include a sapphire (Al2O3), silicon carbide (SiC), gallium nitride (GaN), indium gallium nitride (InGaN), gallium aluminum nitride (AlGaN), aluminum nitride (AlN), gallium oxide (Ga2O3), gallium arsenide (GaAs), or silicon substrate.

In addition, between the growth substrate 90 and the first semiconductor layer 10, a buffer layer 100 may be formed. If a completed micro LED 1 is separated from the growth substrate 90, the buffer layer 100 may enable selective etching of a portion wherein the micro LED 1 is located, and may reduce the degree of lattice mismatch between the growth substrate 90 and the micro LED 1.

Next, as illustrated in FIG. 5, on one surface of the second semiconductor layer 30, a p-electrode 50-1 that is electronically connected with the second semiconductor layer 30 may be formed.

Afterwards, as illustrated in FIG. 6, the second semiconductor layer 30 and the active layer 20 may form a second side surface S2 that is broad in the upper area, and is tilted with respect to the first semiconductor layer 10, and the active layer 20 and the second semiconductor layer 30 may be etched to be stepped with respect to the first semiconductor layer 10 at operation F2.

Here, the active layer 20 and the second semiconductor layer 30 may form the second side surface S2 with isotropic etching. Here, the second side surface S2 may be formed to be tilted at an angle of from 40 to 50 degrees with respect to the vertical side surface of the first semiconductor layer 10.

Also, a portion of the first semiconductor layer 10 may be etched to form the tilted second side surface S2. However, the disclosure is not limited thereto, and only the active layer 20 and the second semiconductor layer 30 may be etched while the first semiconductor layer 10 is not etched, and the second side surface S2 may be formed.

Next, as illustrated in FIG. 7, the first semiconductor layer 10 may be etched in a predetermined size to form the first side surface S1 that extends from a portion of the second side surface S2 and is vertical with respect to the first semiconductor layer 10 at operation F3.

Here, a predetermined size is a size including the determined length D1, and may mean the size of the micro LED 1 to be manufactured.

Accordingly, in the case of etching the first semiconductor layer 10 according to a predetermined size including the determined length D1, a plurality of micro LEDs 1 may be manufactured on one growth substrate 90.

For example, as a predetermined size including the determined length D1 becomes bigger, the number of micro LEDs 1 manufactured on one growth substrate 90 decreases. In addition, as a predetermined size including the determined length D1 becomes smaller, the number of micro LEDs 1 manufactured on one growth substrate 90 increases.

Also, the first semiconductor layer 10 may form a first side surface S1 with unisotropic etching.

Next, as illustrated in FIG. 8, in a part of one surface of the first semiconductor layer 10 wherein the active layer 20 and the second semiconductor layer 30 are not formed among the parts of one surface of the first semiconductor layer 10, an n-electrode 40-1 which is electronically connected with the first semiconductor layer 10 may be formed.

Afterwards, as illustrated in FIG. 9, an insulating layer 70 surrounding the vertical first side surface S1 of the first semiconductor layer 10 and the tilted second side surfaces S2 of the active layer 20 and the second semiconductor layer 30 may be formed at operation F4.

Specifically, a first insulating part 70a surrounding the first side surface S1 and a second insulating part 70b surrounding the second side surface S2 may be formed. That is, an insulating layer 70 may be formed while being laminated on the first side surface S1 and the second side surface S2.

In addition, the insulating layer 70 may be formed through a deposition process. For example, the insulating layer 70 may be deposition-formed through metalorganic chemical vapor deposition (MOCVD).

Also, the insulating layer 70 may be formed integrally. Accordingly, even if an edged part is formed between the vertical first side surface S1 and the tilted second side surface S2 of the micro LED 1, the insulating layer 70 is formed integrally, and thus electrons of the micro LED 1 are detached to the edged part, or a part that is structurally weak is enclosed, and structural stability can thereby be improved.

Next, as illustrated in FIG. 10, in a partial area of the insulating layer 70, a reflective layer 80 surrounding the second side surface S2 may be formed at operation F5. Specifically, a reflective layer 80 may be laminated on the second insulating part 70b of the insulating layer 70.

In addition, the reflective layer 80 may be arranged while being tilted at an angle of from 40 to 50 degrees with respect to the first side surface S1. Accordingly, the direction of the side light provided on the active layer 20 of the micro LED 1 may be changed to the upper direction necessary for implementing a display screen, and the light efficiency of the micro LED 1 can thereby be improved.

Also, the reflective layer 80 may be symmetrically arranged with respect to the active layer 20. Accordingly, the reflective layer 80 may reflect the side light of the active layer 20 on all side surfaces of the active layer 20, and thereby prevent concentration of light provided at the micro LED 1 in the direction of one side of the micro LED 1, and uniform luminance of the micro LED 1 can thereby be implemented.

Afterwards, as illustrated in FIG. 11, a first electrode pad 40 connected with the first semiconductor layer 10 and a second electrode pad 50 connected with the second semiconductor layer 30 may be formed at operation F6.

Specifically, the first electrode pad 40 may be formed to surround the n-electrode 40-1 on the n-electrode 40-1. In addition, the second electrode pad 50 may be formed to surround the p-electrode 50-1 on the p-electrode 50-1.

Also, the first electrode pad 40 may be formed on one surface of the first semiconductor layer 10, and the second electrode pad 50 may be formed on one surface of the second semiconductor layer 30.

In addition, the heights of the first electrode pad 40 and the second electrode pad 50 may be formed to be the same with respect to the first semiconductor layer 10.

Specifically, the height H1 of the first electrode pad 40 and the height H2 of the second electrode pad 50 are different, but based on one surface of the first semiconductor layer 10, the heights of the first electrode pad 40 and the second electrode pad 50 may be formed to be the same.

Accordingly, if the micro LED 1 is a flip chip type, and is mounted on a thin film transistor substrate (not shown), the micro LED 1 may be mounted while being maintained to be parallel without being arranged to be tilted.

Accordingly, irradiation of light emitted from the micro LED 1 may be prevented from being tilted in one direction.

Next, as illustrated in FIG. 12, while the micro LED 1 is combined with the growth substrate 90, laser may be applied to the growth substrate 90, and the first semiconductor layer 10 may thereby be separated from the growth substrate 90. That is, the manufactured micro LED 1 may be separated from the growth substrate 90 by a laser lift-off (LLO) method at operation F7.

For example, after a mask 110 is arranged on the growth substrate 90, laser light Z may be irradiated on the mask 110 in a corresponding location of the growth substrate 90 wherein the micro LED 1 to be separated is located. Accordingly, the micro LED 1 located in an area wherein heat from the laser light Z was transmitted may be separated from the growth substrate 90.

Also, according to a user's selection, the first semiconductor layer 10 may be separated from the growth substrate 90 by a chemical lift-off (CLO) method, not limited to a laser lift-off method.

While the various embodiments have been described separately from one another, the embodiments do not have to be implemented independently, but the configuration and operation of each embodiment may be implemented in combination with at least one other embodiment.

Also, while preferred embodiments have been shown and described, the disclosure is not limited to the aforementioned specific embodiments, and it is apparent that various modifications may be made by those having ordinary skill in the technical field to which the disclosure belongs, without departing from the gist as claimed by the appended claims. Also, it is intended that such modifications are not to be interpreted independently from the technical idea or prospect.

What is claimed is:

1. A micro light emitting diode (LED) comprising:
a first semiconductor layer doped with an n-type dopant;
a second semiconductor layer doped with a p-type dopant, and arranged in a predetermined first area of a bottom surface of the first semiconductor layer;
an active layer arranged between the first semiconductor layer and the second semiconductor layer, and configured to provide light;
a first electrode pad arranged in a predetermined second area of the bottom surface of the first semiconductor layer;
a second electrode pad arranged on the bottom surface of the second semiconductor layer;
a first side surface comprising a vertical side surface of the first semiconductor layer;
a second side surface tilted with respect to the first side surface, and comprising a first tilted side surface of the active layer and a second tilted side surface of the second semiconductor layer;
an insulating layer arranged to surround the first side surface and the second side surface; and
a reflective layer arranged to partially surround the insulating layer in an area of the insulating layer corresponding to the second side surface,
wherein at least one from among a portion of the bottom surface of the first semiconductor layer and a portion of the bottom surface of the second semiconductor layer is exposed.

2. The micro LED of claim 1, wherein the reflective layer is symmetrically arranged with respect to the active layer.

3. The micro LED of claim 1, wherein the reflective layer is arranged at an angle in a range of 40 degrees to 50 degrees with respect to the first side surface.

4. The micro LED of claim 1, wherein the second side surface includes a portion of the first semiconductor layer.

5. The micro LED of claim 1, wherein a height of the first electrode pad with respect to the first semiconductor layer is equal to a height of the second electrode pad with respect to the first semiconductor layer.

6. The micro LED of claim 1, further comprising:
a growth substrate arranged on one surface of the first semiconductor layer; and
a buffer layer arranged between the first semiconductor layer and the growth substrate.

7. The micro LED of claim 1, wherein a length of the micro LED is smaller than or equal to 250 µm.

8. The micro LED of claim 1, wherein a ratio of a length of the micro LED to a sum of a thickness of the first semiconductor layer, a thickness of the insulating layer, and a thickness of the second semiconductor layer is smaller than 50.

9. The micro LED of claim 1, wherein both of the portion of the bottom surface of the first semiconductor layer and the portion of the bottom surface of the second semiconductor layer are exposed.

10. The micro LED of claim 1, wherein a portion of the first side surface is continuously connected with the second side surface, and
wherein the insulating layer is formed integrally on the portion of the first side surface and the second side surface.

11. The micro LED of claim 10,
wherein the insulating layer includes:
a first insulating part arranged on the first side surface; and
a second insulating part arranged on the second side surface, and
wherein the first insulating part is formed integrally with the second insulating part.

12. A manufacturing method of a micro light emitting diode (LED) comprising:
sequentially forming, on a growth substrate, a first semiconductor layer doped with an n-type dopant, an active layer configured to provide light, and a second semiconductor layer doped with a p-type dopant;
forming a second side surface tilted with respect to the first semiconductor layer, and comprising a first tilted side surface of the active layer and a second tilted side surface of the second semiconductor layer;
etching the active layer and the second semiconductor layer to be stepped with respect to the first semiconductor layer;
etching the first semiconductor layer in a predetermined size to form a first side surface which extends from a portion of the second side surface and which is vertical to the first semiconductor layer;

forming an insulating layer surrounding the first side surface and the second side surface;

forming a reflective layer partially surrounding the insulating layer in an area of the insulating layer corresponding to the second side surface;

forming a first electrode pad connected with the first semiconductor layer and a second electrode pad connected with the second semiconductor layer; and separating the first semiconductor layer from the growth substrate, wherein at least one from among a portion of a bottom surface of the first semiconductor layer and a portion of a bottom surface of the second semiconductor layer is exposed after the insulating layer is formed.

13. The manufacturing method of a micro LED of claim 12, wherein the reflective layer is symmetrically formed with respect to the active layer.

14. The manufacturing method of a micro LED of claim 12, wherein the reflective layer is formed at an angle in a range of 40 degrees to 50 degrees with respect to the first side surface.

15. The manufacturing method of a micro LED of claim 12, wherein a height of the first electrode pad with respect to the first semiconductor layer is equal to a height of the second electrode pad with respect to the first semiconductor layer.

16. The manufacturing method of a micro LED of claim 12, wherein the first semiconductor layer is separated from the growth substrate by a laser or chemical lift off method.

17. The manufacturing method of a micro LED of claim 12, wherein the active layer and the second semiconductor layer are etched with isotropic etching.

18. The manufacturing method of a micro LED of claim 12, wherein the first semiconductor layer is etched with unisotropic etching.

* * * * *